United States Patent
Miyazaki et al.

(10) Patent No.: US 12,451,816 B2
(45) Date of Patent: Oct. 21, 2025

(54) SUB-MODULE OF POWER CONVERSION DEVICE

(71) Applicant: TOSHIBA MITSUBISHI-ELECTRIC INDUSTRIAL SYSTEMS CORPORATION, Chuo-ku (JP)

(72) Inventors: Yuki Miyazaki, Chuo-ku (JP); Akira Sato, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 0 days.

(21) Appl. No.: 18/259,719

(22) PCT Filed: Nov. 5, 2021

(86) PCT No.: PCT/JP2021/040791
§ 371 (c)(1),
(2) Date: Jun. 28, 2023

(87) PCT Pub. No.: WO2023/079685
PCT Pub. Date: May 11, 2023

(65) Prior Publication Data
US 2024/0072679 A1 Feb. 29, 2024

(51) Int. Cl.
*H02M 7/5387* (2007.01)
*H02M 7/00* (2006.01)
*H05K 7/20* (2006.01)

(52) U.S. Cl.
CPC ......... *H02M 7/003* (2013.01); *H02M 7/5387* (2013.01); *H05K 7/20909* (2013.01)

(58) Field of Classification Search
CPC ..... H02M 7/003; H02M 7/5387; H05K 7/209
See application file for complete search history.

(56) References Cited

U.S. PATENT DOCUMENTS

| | | | |
|---|---|---|---|
| 11,750,080 B2 * | 9/2023 | Kajiyama | H02M 5/12 363/40 |
| 2018/0191238 A1 | 7/2018 | Tsuchiya | |
| 2020/0036137 A1 | 1/2020 | Habeb | |

(Continued)

FOREIGN PATENT DOCUMENTS

| | | |
|---|---|---|
| CN | 209642560 U | 11/2019 |
| EP | 3 661 042 A1 | 6/2020 |

(Continued)

OTHER PUBLICATIONS

Written Opinion of the International Searching Authority issued Jan. 1, 2022 in PCT/JP2021/040791 (with English Translation), 9 pages.

(Continued)

*Primary Examiner* — Adolf D Berhane
(74) *Attorney, Agent, or Firm* — Oblon, McClelland, Maier &Neustadt, L.L.P.

(57) ABSTRACT

A sub-module of a power conversion device includes: an IGBT, a drive circuit that drives the IGBT, a laminated bus bar on which the IGBT is mounted; a substrate on which the drive circuit is mounted; a housing frame for accommodating the IGBT, the drive circuit, the laminated bus bar, and the substrate; and a separation frame for separating a space in which the drive circuit and the substrate are disposed from a space in which the IGBT and the laminated bus bar are disposed.

5 Claims, 6 Drawing Sheets

(56) References Cited

U.S. PATENT DOCUMENTS

2020/0366216 A1    11/2020  Usui
2024/0072679 A1*   2/2024   Miyazaki .............. H02M 7/003

FOREIGN PATENT DOCUMENTS

| | | |
|---|---|---|
| EP | 2 681 835 B1 | 7/2020 |
| JP | 10-295087 A | 11/1998 |
| WO | WO 2016/203516 A1 | 12/2016 |
| WO | WO 2019/021532 A1 | 1/2019 |
| WO | WO 2019/043849 A1 | 3/2019 |

OTHER PUBLICATIONS

International Search Report issued Jan. 18, 2022 in PCT/JP2021/040791 filed on Nov. 5, 2021, 4 pages.
Extended European Search Report issued Jun. 13, 2025 in European Patent Application No. 21963280.9, 11 pages.

* cited by examiner

SUB-MODULE OF POWER CONVERSION DEVICE

TECHNICAL FIELD

The present disclosure relates to a sub-module of a power conversion device.

BACKGROUND ART

In recent years, it has been considered to apply a modular multilevel converter (MMC) to a self-excited reactive power compensation apparatus such as a static synchronous compensator (STATCOM), a direct-current (DC) power transmission system such as a back to back (BTB) system, a motor drive inverter, and the like (for example, see PCT International Publication No. WO 2016/203516 (PTL 1)).

The MMC is configured with a plurality of unit converters connected in series. Each of the unit converters includes: a capacitor; a power converter that transmits and receives electric power between the capacitor and an alternating-current (AC) power supply; and a drive circuit that drives the power converter based on a control signal supplied from a higher-level controller that controls the entire MMC. The power converter includes a plurality of insulated gate bipolar transistors (IGBT).

CITATION LIST

Patent Literature

PTL 1: PCT International Publication No. WO 2016/203516

SUMMARY OF INVENTION

Technical Problem

When components of the power conversion device are divided into a plurality of sub-modules and one of the sub-modules of the power conversion device includes an IGBT, a laminated bus bar on which the IGBT is mounted, a drive circuit, and a substrate on which the drive circuit is mounted, the following problem occurs.

When the substrate and a heat source such as the IGBT and the laminated bus bar are disposed in the same space, the substrate is heated by the heat source.

Thus, an object of the present disclosure is to provide a sub-module of a power conversion device that is capable of suppressing heating of a substrate.

Solution to Problem

A power conversion device of the present disclosure includes: an IGBT; a drive circuit that drives the IGBT; a laminated bus bar on which the IGBT is mounted; a substrate on which the drive circuit is mounted; a housing frame for accommodating the IGBT, the drive circuit, the laminated bus bar, and the substrate; and a separation frame for separating a space in which the drive circuit and the substrate are disposed from a space in which the IGBT and the laminated bus bar are disposed.

Advantageous Effects of Invention

According to the present disclosure, heating of the substrate can be suppressed.

DESCRIPTION OF EMBODIMENTS

The following describes embodiments with reference to the accompanying drawings.

First Embodiment

Figure 1:
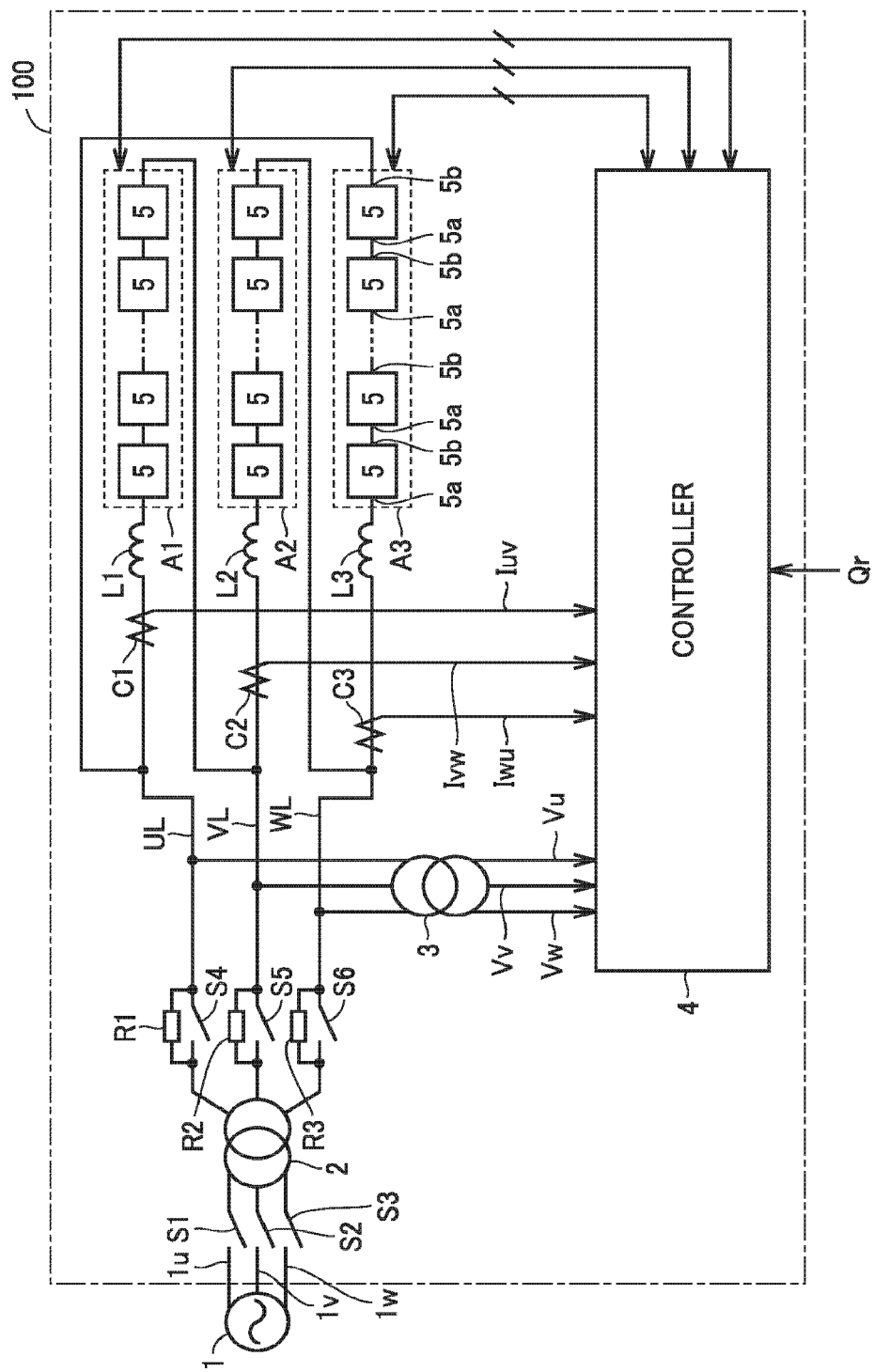
FIG. 1 is a configuration diagram of a power conversion device 100 according to an embodiment.

FIG. 1 is a configuration diagram of a power conversion device 100 according to an embodiment.

Power conversion device 100 is used as a reactive power compensation apparatus configured to compensate for reactive power in a power system 1. Referring to FIG. 1, power conversion device 100 includes: arms A1 to A3 each configured with a series connection of at least one or more unit converters 5 in a main circuit power supply system; and a controller 4 configured to control at least one or more unit converters 5. More specifically, power conversion device 100 includes switches S1 to S6, transformers 2 and 3, current-limiting resistors R1 to R3, AC lines UL, VL, and WL, current transformers C1 to C3, reactors L1 to L3, arms A1 to A3, and controller 4.

Switches S1, S2, and S3 each have: one terminal connected to a corresponding one of power transmission lines 1u, 1v, and 1w of three phases in power system 1; and the other terminal connected to a corresponding one of three primary windings of transformer 2. Switches S1 to S3 each are in a conductive state under a normal condition, and set in a non-conductive state, for example, during maintenance of power conversion device 100. Transformer 2 includes three primary windings and three secondary windings, and transmits and receives three-phase AC power.

Current-limiting resistors R1, R2, and R3 each have: one terminal connected to a corresponding one of three secondary windings of transformer 2; and the other terminal connected to a corresponding one of AC lines UL, VL, and WL. Current-limiting resistors R1 to R3 each limit a current flowing through a corresponding one of arms A1 to A3 from power system 1 when power conversion device 100 is activated.

Switches S4, S5, and S6 are connected in parallel to current-limiting resistors R1, R2, and R3, respectively. Switches S4 to S6 each are set in a conductive state after the current flowing through a corresponding one of arms A1 to A3 is stabilized when power conversion device 100 is activated. Transformer 3 outputs, to controller 4, three-phase AC voltages Vu, Vv, and Vw of values corresponding to the AC voltages on AC lines UL, VL, and WL, respectively.

Reactor L1 and arm A1 are connected in series between AC lines UL and VL. Reactor L2 and arm A2 are connected in series between AC lines VL and WL. Reactor L3 and arm A3 are connected in series between AC lines WL and UL. In other words, arms A1 to A3 are delta-connected. Arms A1 to A3 are controlled by controller 4 to generate three-phase AC power.

Each of arms A1 to A3 includes a plurality of unit converters 5 that are cascade-connected. Each of the plurality of unit converters 5 generates AC power according to the control signal from controller 4.

A first terminal 5a of unit converter 5 in the first stage of arm A1 is connected to one terminal of reactor L1. In arm A1, a second terminal 5b of each of unit converters 5 other than unit converter 5 in the last stage is connected to a corresponding one of first terminals 5a of unit converters 5 in the subsequent stages. Second terminal 5b of unit converter 5 in the last stage in arm A1 is connected to one terminal of reactor L2.

A first terminal 5a of unit converter 5 in the first stage in arm A2 is connected to one terminal of reactor L2. In arm A2, a second terminal 5b of each of unit converters 5 other than unit converter 5 in the last stage is connected to a corresponding one of first terminals 5a of unit converters 5 in the subsequent stages. Second terminal 5b of unit converter 5 in the last stage in arm A2 is connected to one terminal of reactor L3.

A first terminal 5a of unit converter 5 in the first stage in arm A3 is connected to one terminal of reactor L3. In arm A3, a second terminal 5b of each of unit converters 5 other than unit converter 5 in the last stage is connected to a corresponding one of first terminals 5a of unit converters 5 in the subsequent stages. Second terminal 5b of unit converter 5 in the last stage in arm A3 is connected to one terminal of reactor L1.

Reactors L1, L2, and L3 suppress the circulating currents flowing through arms A1, A2 and A3, respectively. Current transformers C1, C2, and C3 detect AC currents Iuv, Ivw, and Iwu flowing through arms A1, A2, and A3, respectively, and output the detected currents to controller 4.

Controller 4 receives inputs such as a reactive power command value Qr, three-phase AC voltages Vu, Vv, and Vw, AC currents Iuv, Ivw, and Iwu, and a DC voltage Vdc (which will be described later), and outputs a control signal GC, a gate block signal GB, a gate deblock signal DEB, a conduction command Son and the like (each of which will be described later), to thereby control each of three arms A1 to A3 (i.e., each of a plurality of unit converters 5). Reactive power command value Qr is provided, for example, from a center control unit (not shown) in power system 1. Power conversion device 100 supplies reactive power of the value corresponding to reactive power command value Qr to power system 1.

Figure 2:
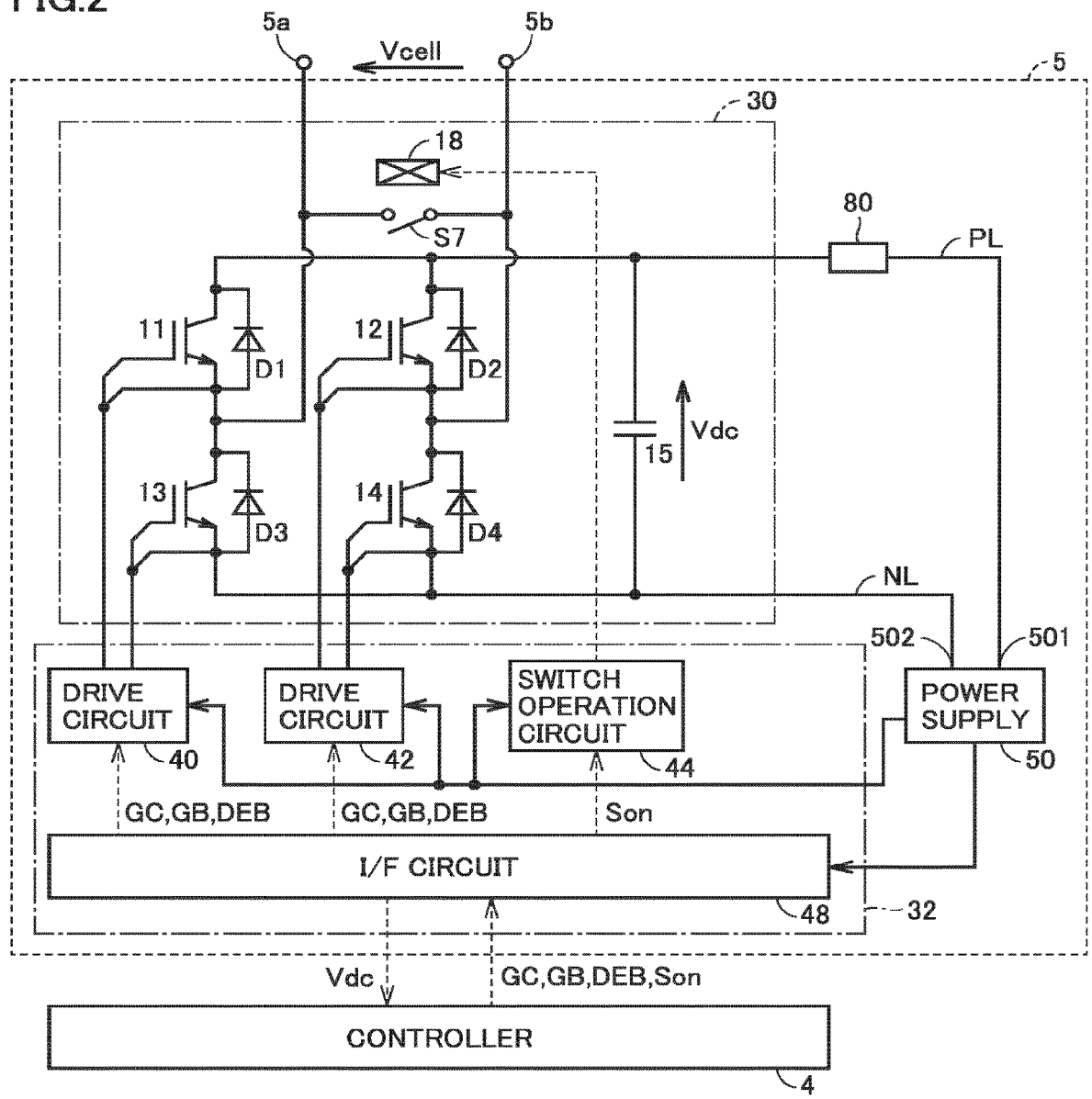
FIG. 2 is a circuit block diagram showing a configuration of a unit converter 5.

FIG. 2 is a circuit block diagram showing the configuration of unit converter 5. Referring to FIG. 2, unit converter 5 includes a main circuit 30, a control circuit 32, a current-limiting resistance circuit 80, and a power supply 50.

Main circuit 30 is formed of a full bridge circuit including a capacitor. Specifically, main circuit 30 has a first terminal 5a and a second terminal 5b. Main circuit 30 includes IGBTs 11 to 14, diodes D1 to D4, and a first capacitor 15. Main circuit 30 controls conduction/non-conduction of each of IGBTs 11 to 14, to output a voltage pulse having an amplitude corresponding to the voltage across first capacitor 15 between first terminal 5a and second terminal 5b so as to perform power conversion.

IGBTs 11 to 14 each are a self-arc-extinguishing-type power semiconductor element. IGBTs 11 and 13 are connected in series between a first DC line PL and a second DC line NL. IGBTs 12 and 14 are connected in series between first DC line PL and second DC line NL. IGBTs 11 and 12 have collectors connected to first DC line PL while IGBTs 13 and 14 have emitters connected to second DC line NL. A connection point between the emitter of IGBT 11 and the collector of IGBT 13 is connected to first terminal 5a. A connection point between the emitter of IGBT 12 and the collector of IGBT 14 is connected to second terminal 5b.

Diodes D1, D2, D3, and D4 are connected in anti-parallel with IGBTs 11, 12, 13, and 14, respectively. First capacitor 15 is electrically connected between first DC line PL and second DC line NL and stores DC power therein.

In unit converter 5, conduction/non-conduction of each of IGBTs 11 to 14 is controlled by control circuit 32. IGBTs 11 and 13 are controlled to be conductive in a manner complementary to each other. IGBTs 12 and 14 are controlled to be conductive in a manner complementary to each other.

Main circuit 30 further includes a switch S7. Switch S7 is connected between first terminal 5a and second terminal 5b. Switch S7 is closed in response to conduction command Son from control circuit 32 so as to allow short-circuiting of first terminal 5a and second terminal 5b.

Control circuit 32 includes drive circuits 40 and 42, a switch operation circuit 44, and an interface (I/F) circuit 48. Control circuit 32 is configured to control each of IGBTs 11 to 14 to be conductive/non-conductive according to the control signal received from controller 4.

I/F circuit 48 communicates with controller 4 by wire (not shown) or wirelessly. From controller 4, I/F circuit 48 receives control signal GC for controlling the full bridge circuit in main circuit 30. From controller 4, OF circuit 48 further receives gate block signal GB for fixing each of IGBTs 11 to 14 forming a full bridge circuit in a non-conductive state. From controller 4, OF circuit 48 receives gate deblock signal DEB for canceling fixation of the non-conductive states of IGBTs 11 to 14 forming a full bridge circuit. OF circuit 48 outputs the received control signal GC, gate block signal GB, and gate deblock signal DEB to drive circuits 40 and 42.

In response to control signal GC, drive circuit 40 controls conduction/non-conduction of each of IGBTs 11 and 13. In response to gate block signal GB, drive circuit 40 fixes each of IGBTs 11 and 13 in a non-conductive state (a deactivated state or a gate block state). In response to gate deblock signal DEB, drive circuit 40 cancels fixation of the non-conductive states of IGBTs 11 and 13 (to be in a non-gate block state or in a gate deblock state).

In response to control signal GC, drive circuit 42 controls conduction/non-conduction of each of IGBTs 12 and 14. In response to gate block signal GB, drive circuit 42 fixes each of IGBTs 12 and 14 in a non-conductive state (a deactivated state or a gate block state). In response to gate deblock signal DEB, drive circuit 42 cancels fixation of the non-conductive states of IGBTs 12 and 14 (to be in a non-gate block state or in a gate deblock state).

Switch operation circuit 44 serves as a circuit for operating switch S7. In response to a command from controller 4, switch operation circuit 44 controls power conduction to an excitation coil 18. During the normal operation, current supply to excitation coil 18 is stopped, so that switch S7 is brought into a non-conductive state. On the other hand, when controller 4 detects an abnormality such as a short-circuit fault in any of IGBTs 11 to 14 in one unit converter 5 of the plurality of unit converters 5, controller 4 outputs conduction command Son for switch S7 to this one unit converter 5 having such a fault. In unit converter 5 having a fault, I/F circuit 48 receives conduction command Son and outputs the received conduction command Son to switch operation circuit 44. In response to conduction command Son, switch operation circuit 44 supplies a current to excitation coil 18, to thereby set switch S7 in a conductive state. Thus, the output of unit converter 5 having a fault is short-circuited.

Current-limiting resistance circuit 80 is interposed in first DC line PL between main circuit 30 and power supply 50. Current-limiting resistance circuit 80 lowers DC voltage Vdc of first capacitor 15.

Power supply 50 includes input terminals 501 and 502. Input terminal 501 is connected to first DC line PL. Input terminal 502 is connected to second DC line NL. Power supply 50 is electrically connected in parallel to first capacitor 15. Power supply 50 lowers the voltage of first capacitor 15 to generate a power supply voltage and supplies the power supply voltage to control circuit 32. Thereby, unit converter 5 forms a cell of a self-contained type that is capable of supplying electric power from main circuit 30 to control circuit 32.

The power conversion device includes a plurality of sub-modules. Each of the sub-modules includes one or more components of the above-described power conversion device.

(Sub-Module of Power Conversion Device According to Reference Example)

Figure 3:
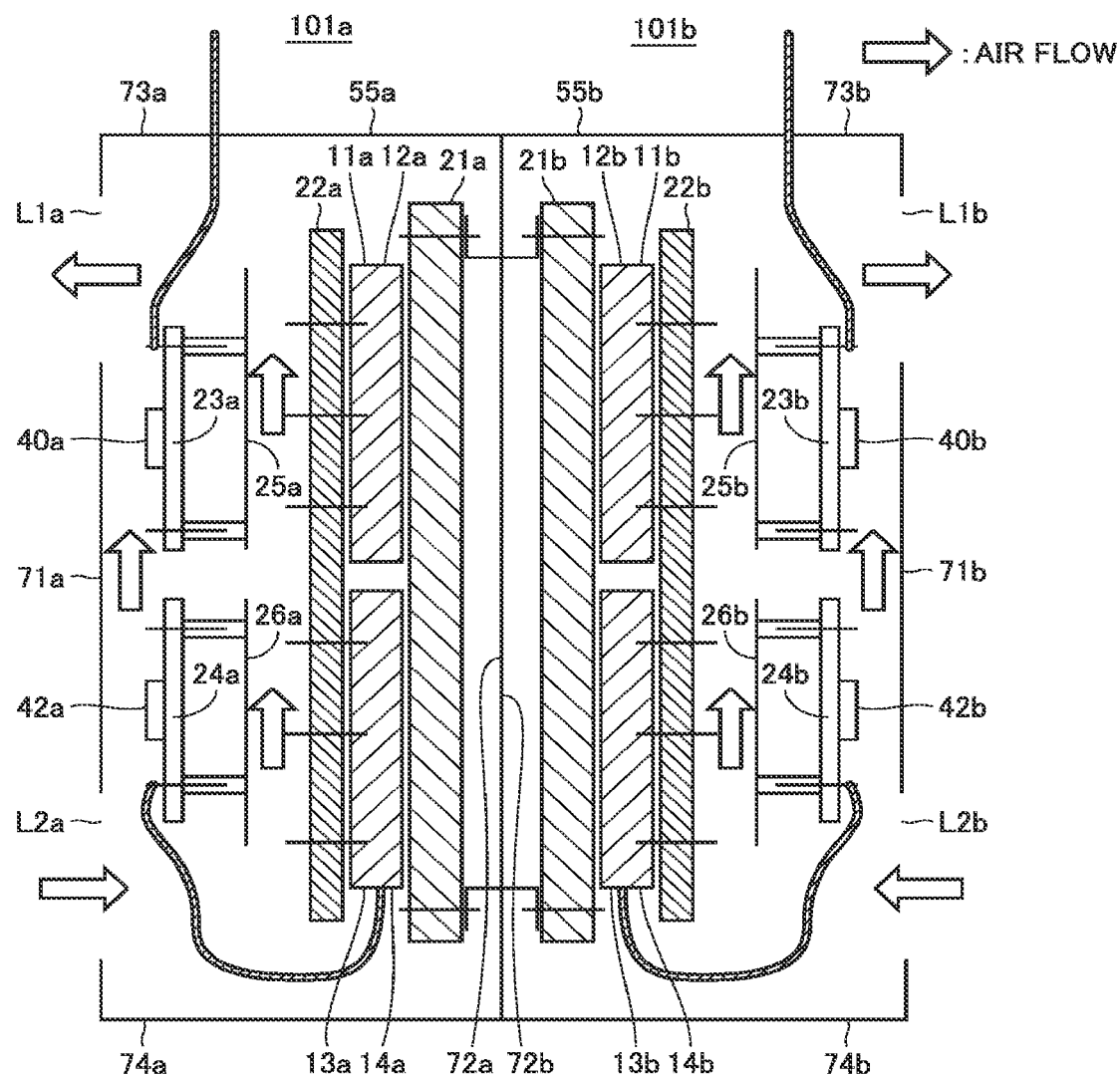
FIG. 3 is a cross-sectional view of a first sub-module 101a and a second sub-module 101b of a power conversion device according to Reference Example 1.

FIG. 3 is a cross-sectional view of a first sub-module 101a and a second sub-module 101b of the power conversion device according to Reference Example 1.

In Reference Example 1, two sub-modules constitute one set, and the two sub-modules are located adjacent to each other.

First sub-module 101a of the power conversion device includes a first IGBT 11a, a second IGBT 12a, a third IGBT 13a, and a fourth IGBT 14a.

First sub-module 101a of the power conversion device further includes a first drive circuit 40a and a second drive circuit 42a. First drive circuit 40a drives first IGBT 11a and second IGBT 12a. Second drive circuit 42a drives third IGBT 13a and fourth IGBT 14a.

First sub-module 101a of the power conversion device further includes a laminated bus bar 22a. Laminated bus bar 22a has first IGBT 11a, second IGBT 12a, third IGBT 13a, and fourth IGBT 14a mounted thereon.

First sub-module 101a of the power conversion device further includes a first support plate 25a, a second support plate 26a, a first substrate 23a, and a second substrate 24a. First substrate 23a has first drive circuit 40a mounted thereon. Second substrate 24a has second drive circuit 42a mounted thereon. First support plate 25a supports first substrate 23a. Second support plate 26a supports second substrate 24a.

First sub-module 101a of the power conversion device further includes a cooling fin 21a and a housing frame 55a.

Housing frame 55a is a frame body formed in a rectangular parallelepiped frame shape.

Housing frame 55a accommodates cooling fin 21a, first IGBT 11a, second IGBT 12a, third IGBT 13a, fourth IGBT 14a, first drive circuit 40a, second drive circuit 42a, laminated bus bar 22a, first support plate 25a, second support plate 26a, first substrate 23a, and second substrate 24a.

Cooling fin 21a is disposed such that the depth direction of cooling fin 21a is perpendicular to a first surface 71a and a second surface 72a of housing frame 55a that face each other. Cooling fin 21a is located close to second surface 72a.

In the inner space of housing frame 55a, first IGBT 11a, second IGBT 12a, third IGBT 13a, and fourth IGBT 14a are located closest to cooling fin 21a. In the inner space of housing frame 55a, laminated bus bar 22a is located second closest to cooling fin 21a. In the inner space of housing frame 55a, first support plate 25a and second support plate 26a are located third closest to cooling fin 21a. In the inner space of housing frame 55a, first substrate 23a and second substrate 24a are located fourth closest to cooling fin 21a. In the inner space of housing frame 55a, first drive circuit 40a and second drive circuit 42a are located fifth closest to cooling fin 21a.

First surface 71a is provided with two openings L1a and L2a in order for air to flow into and out of the inner space of housing frame 55a.

First sub-module 101a configured as described above has the following problem. First IGBT 11a, second IGBT 12a, third IGBT 13a, fourth IGBT 14a, and laminated bus bar 22a are disposed in the same continuous space as that in which first substrate 23a and second substrate 24a are disposed. Thus, first substrate 23a and second substrate 24a are heated by the heat generated by first IGBT 11a, second IGBT 12a, third IGBT 13a, fourth IGBT 14a, and laminated bus bar 22a.

Second sub-module 101b of the power conversion device includes a first IGBT 11b, a second IGBT 12b, a third IGBT 13b, and a fourth IGBT 14b.

Second sub-module 101b of the power conversion device further includes a first drive circuit 40b and a second drive circuit 42b. First drive circuit 40b drives first IGBT 11b and second IGBT 12b. Second drive circuit 42b drives third IGBT 13b and fourth IGBT 14b.

Second sub-module 101b of the power conversion device further includes a laminated bus bar 22b. Laminated bus bar 22b has first IGBT 11b, second IGBT 12b, third IGBT 13b, and fourth IGBT 14b mounted thereon.

Second sub-module 101b of the power conversion device further includes a first support plate 25b, a second support plate 26b, a first substrate 23b, and a second substrate 24b. First substrate 23b has first drive circuit 40b mounted thereon. Second substrate 24b has second drive circuit 42b mounted thereon. First support plate 25b supports first substrate 23b. Second support plate 26b supports second substrate 24b.

Second sub-module 101b of the power conversion device further includes a cooling fin 21b, a housing frame 55b, and a separation frame 52b.

Housing frame 55b is a frame body formed in a rectangular parallelepiped frame shape.

Housing frame 55b accommodates cooling fin 21b, first IGBT 11b, second IGBT 12b, third IGBT 13b, fourth IGBT 14b, first drive circuit 40b, second drive circuit 42b, laminated bus bar 22b, first support plate 25b, second support plate 26b, first substrate 23b, and second substrate 24b.

Cooling fin 21b is disposed such that the depth direction of cooling fin 21b is perpendicular to a first surface 71b and a second surface 72b of housing frame 55b that face each other. Cooling fin 21b is located close to second surface 72b.

In the inner space of housing frame 55b, first IGBT 11b, second IGBT 12b, third IGBT 13b, and fourth IGBT 14b are disposed closest to cooling fin 21b. In the inner space of housing frame 55a, laminated bus bar 22b is disposed second closest to cooling fin 21b. In the inner space of housing frame 55b, first support plate 25b and second support plate 26b are disposed third closest to cooling fin 21b. In the inner space of housing frame 55b, first substrate 23b and second substrate 24b are disposed fourth closest to cooling fin 21b. In the inner space of housing frame 55b, first drive circuit 40b and second drive circuit 42b are disposed fifth closest to cooling fin 21b.

First surface 71b is provided with two openings L1b and L2b in order for air to flow into and out of the inner space of housing frame 55b.

Second sub-module 101b configured as described above has the following problem. First IGBT 11b, second IGBT 12b, third IGBT 13b, fourth IGBT 14b, and laminated bus bar 22b are disposed in the same continuous space as that in which first substrate 23b and second substrate 24b are disposed. Thus, first substrate 23b and second substrate 24b are heated by the heat generated by first IGBT 11b, second IGBT 12b, third IGBT 13b, fourth IGBT 14b, and laminated bus bar 22b.

(Sub-Module of Power Conversion Device According to First Embodiment)

Figure 4:
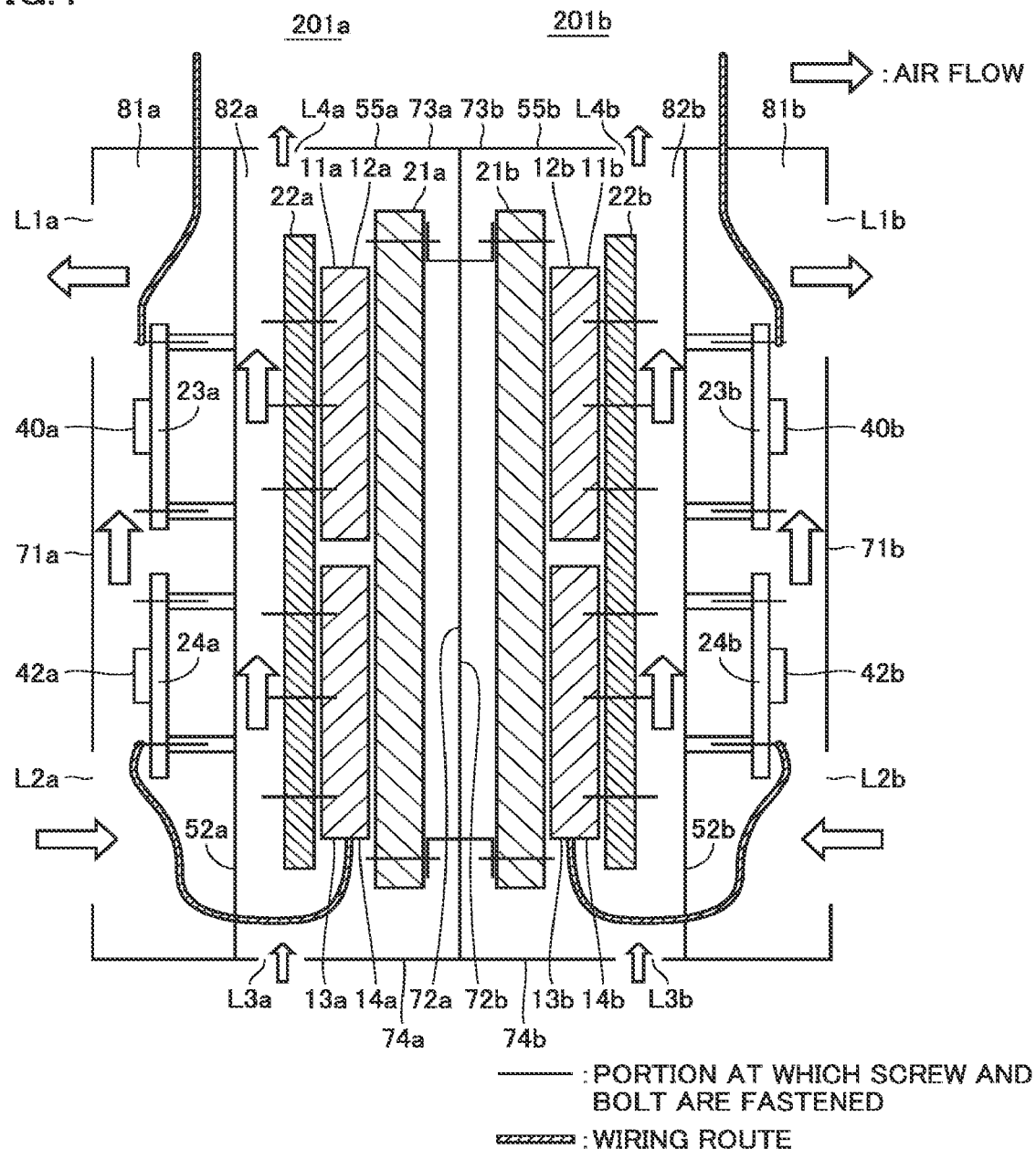
FIG. 4 is a cross-sectional view of a first sub-module 201a and a second sub-module 201b of a power conversion device according to a first embodiment.

FIG. 4 is a cross-sectional view of a first sub-module 201a and a second sub-module 201b of the power conversion device according to the first embodiment.

In the first embodiment, two sub-modules constitute one set, and these two sub-modules are located adjacent to each other, similarly to the reference example.

First sub-module 201a of the power conversion device includes a first IGBT 11a, a second IGBT 12a, a third IGBT 13a, and a fourth IGBT 14a.

First sub-module 201a of the power conversion device further includes a first drive circuit 40a and a second drive circuit 42a. First drive circuit 40a drives first IGBT 11a and second IGBT 12a. Second drive circuit 42a drives third IGBT 13a and fourth IGBT 14a.

First sub-module 201a of the power conversion device further includes a laminated bus bar 22a. Laminated bus bar 22a has first IGBT 11a, second IGBT 12a, third IGBT 13a, and fourth IGBT 14a mounted thereon.

First sub-module 201a of the power conversion device further includes a first substrate 23a and a second substrate 24a. First substrate 23a has first drive circuit 40a mounted thereon. Second substrate 24a has second drive circuit 42a mounted thereon.

First sub-module 201a of the power conversion device further includes a cooling fin 21a, a housing frame 55a, and a separation frame 52a.

Housing frame 55a is a frame body formed in a rectangular parallelepiped frame shape.

Housing frame 55a accommodates cooling fin 21a, first IGBT 11a, second IGBT 12a, third IGBT 13a, fourth IGBT 14a, first drive circuit 40a, second drive circuit 42a, laminated bus bar 22a, first substrate 23a, and second substrate 24a.

Cooling fin 21a is disposed such that the depth direction of cooling fin 21a is perpendicular to first surface 71a and second surface 72a of housing frame 55a that face each other. Cooling fin 21a is located close to second surface 72a.

In the inner space of housing frame 55a, first IGBT 11a, second IGBT 12a, third IGBT 13a, and fourth IGBT 14a are disposed closest to cooling fin 21a in parallel with first surface 71a and second surface 72a. In the inner space of housing frame 55a, laminated bus bar 22a is disposed second closest to cooling fin 21a in parallel with first surface 71a and second surface 72a. In the inner space of housing frame 55a, first substrate 23a and second substrate 24a are disposed third closest to cooling fin 21a in parallel with first surface 71a and second surface 72a. In the inner space of housing frame 55a, first drive circuit 40a and second drive circuit 42a are disposed fourth closest to cooling fin 21a in parallel with first surface 71a and second surface 72a.

Separation frame 52a separates the inner space of housing frame 55a into a first region 81a and a second region 82a. In first region 81a, first drive circuit 40a, second drive circuit 42a, first substrate 23a, and second substrate 24a are disposed. In second region 82a, first IGBT 11a, second IGBT 12a, third IGBT 13a, fourth IGBT 14a, and laminated bus bar 22a are disposed.

Separation frame 52a is joined to a third surface 73a and a fourth surface 74a. A region surrounded by separation frame 52a, first surface 71a, third surface 73a, and fourth surface 74a is defined as first region 81a. A region surrounded by separation frame 52a, second surface 72a, third surface 73a, and fourth surface 74a is defined as second region 82a.

In order for air to flow into and out of first region 81a, first surface 71a is provided with two openings L1a and L2a. In order for air to flow into and out of second region 82a, fourth surface 74a is provided with an opening L3a and third surface 73a is provided with an opening L4a.

First sub-module 201a configured as described above has the following advantage. Separation frame 52a separates second region 82a from first region 81a. In second region 82a, first IGBT 11a, second IGBT 12a, third IGBT 13a, fourth IGBT 14a, and laminated bus bar 22a are disposed. In first region 81a, first substrate 23a and second substrate 24a are disposed. This makes it possible to suppress heating of first substrate 23a and second substrate 24a by the heat generated by first IGBT 11a, second IGBT 12a, third IGBT 13a, fourth IGBT 14a, and laminated bus bar 22a.

Second sub-module 201b of the power conversion device includes a first IGBT 11b, a second IGBT 12b, a third IGBT 13b, and a fourth IGBT 14b.

Second sub-module 201b of the power conversion device further includes a first drive circuit 40b and a second drive circuit 42b. First drive circuit 40b drives first IGBT 11b and second IGBT 12b. Second drive circuit 42b drives third IGBT 13b and fourth IGBT 14b.

Second sub-module 201b of the power conversion device further includes a laminated bus bar 22b. Laminated bus bar 22b has first IGBT 11b, second IGBT 12b, third IGBT 13b, and fourth IGBT 14b mounted thereon.

Second sub-module 201b of the power conversion device further incudes a first substrate 23b and a second substrate 24b. First substrate 23b has first drive circuit 40b mounted thereon. Second substrate 24b has second drive circuit 42b mounted thereon.

Second sub-module 201b of the power conversion device further includes a cooling fin 21b, a housing frame 55b, and a separation frame 52b.

Housing frame 55b is a frame body formed in a rectangular parallelepiped frame shape.

Housing frame 55b accommodates cooling fin 21b, first IGBT 11b, second IGBT 12b, third IGBT 13b, fourth IGBT 14b, first drive circuit 40b, second drive circuit 42b, laminated bus bar 22b, first substrate 23b, and second substrate 24b.

Cooling fin 21b is disposed such that the depth direction of cooling fin 21b is perpendicular to a first surface 71b and a second surface 72b of housing frame 55b that face each other. Cooling fin 21b is disposed close to second surface 72b. Second surface 72b of housing frame 55b overlaps with second surface 72a of housing frame 55a. Second surface 72a and second surface 72b may be the same surface.

In the inner space of housing frame 55b, first IGBT 11b, second IGBT 12b, third IGBT 13b, and fourth IGBT 14b are disposed closest to cooling fin 21b in parallel with first surface 71b and second surface 72b. In the inner space of housing frame 55a, laminated bus bar 22b is disposed second closest to cooling fin 21b in parallel with first surface 71b and second surface 72b. In the inner space of housing frame 55b, first substrate 23b and second substrate 24b are disposed third closest to cooling fin 21b in parallel with first surface 71b and second surface 72b. In the inner space of housing frame 55b, first drive circuit 40b and second drive circuit 42b are disposed fourth closest to cooling fin 21b in parallel with first surface 71b and second surface 72b.

Separation frame 52b separates the inner space of housing frame 55b into a first region 81b and a second region 82b. In first region 81b, first drive circuit 40b, second drive circuit 42b, first substrate 23b, and second substrate 24b are disposed. In second region 82b, first IGBT 11b, second IGBT 12b, third IGBT 13b, fourth IGBT 14b, and laminated bus bar 22b are disposed.

Separation frame 52b is joined to a third surface 73b and a fourth surface 74b. A region surrounded by separation frame 52b, first surface 71b, third surface 73b, and fourth surface 74b is defined as first region 81b. A region surrounded by separation frame 52b, second surface 72b, third surface 73b, and fourth surface 74b is defined as second region 82b.

In order for air to flow into and out of first region 81b, first surface 71b is provided with two openings L1b and L2b. In order for air to flow into and out of second region 82b, fourth surface 74b is provided with an opening L3b and third surface 73b is provided with an opening L4b.

Second sub-module 201b configured as described above has the following advantage. Separation frame 52b separates second region 82b from first region 81b. In second region 82b, first IGBT 11b, second IGBT 12b, third IGBT 13b, fourth IGBT 14b, and laminated bus bar 22b are disposed. In first region 81b, first substrate 23b and second substrate 24b are disposed. This makes it possible to suppress heating of first substrate 23b and second substrate 24b by the heat generated by first IGBT 11b, second IGBT 12b, third IGBT 13b, fourth IGBT 14b, and laminated bus bar 22b.

Second Embodiment (Sub-Module of Power Conversion Device According to Second Embodiment)

Figure 5:
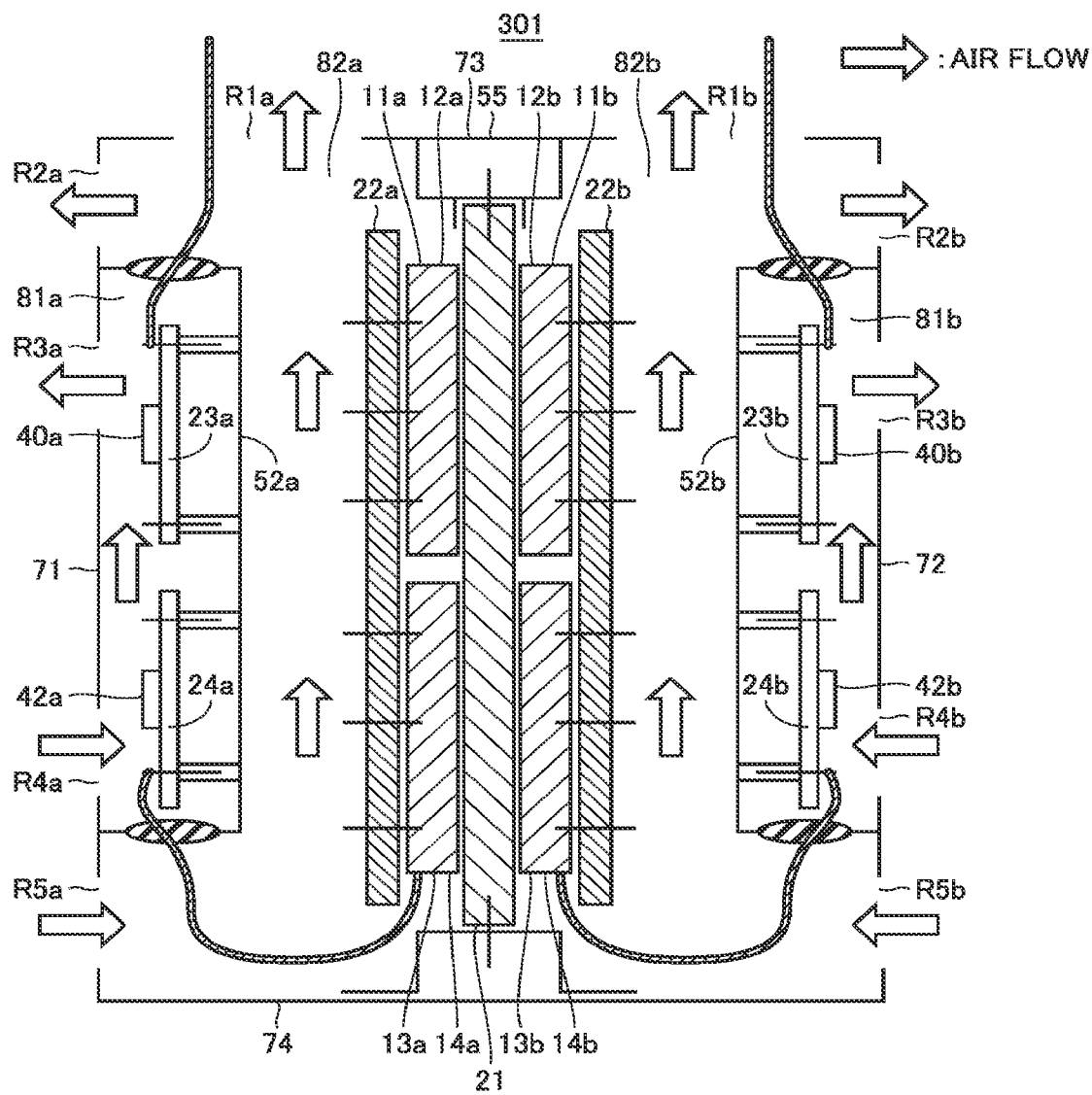
FIG. 5 is a cross-sectional view of a sub-module 301 of a power conversion device according to a second embodiment.

FIG. 5 is a cross-sectional view of a sub-module 301 of a power conversion device according to the second embodiment.

Sub-module 301 of the power conversion device includes a first IGBT 11a, a second IGBT 12a, a third IGBT 13a, a fourth IGBT 14a, a fifth IGBT 11b, a sixth IGBT 12b, a seventh IGBT 13b, and an eighth IGBT 14b.

Sub-module 301 further includes a first drive circuit 40a, a second drive circuit 42a, a third drive circuit 40b, and a fourth drive circuit 42b. First drive circuit 40a drives first IGBT 11a and second IGBT 12a. Second drive circuit 42a drives third IGBT 13a and fourth IGBT 14a. Third drive circuit 40b drives fifth IGBT 11b and sixth IGBT 12b. Fourth drive circuit 42b drives seventh IGBT 13b and eighth IGBT 14b.

Sub-module 301 of the power conversion device further includes a first laminated bus bar 22a and a second laminated bus bar 22b. First laminated bus bar 22a has first IGBT 11a, second IGBT 12a, third IGBT 13a, and fourth IGBT 14a mounted thereon. Second laminated bus bar 22b has fifth IGBT 11b, sixth IGBT 12b, seventh IGBT 13b, and eighth IGBT 14b mounted thereon.

Sub-module 301 of the power conversion device further includes a first substrate 23a, a second substrate 24a, a third substrate 23b, and a fourth substrate 24b. First substrate 23a has first drive circuit 40a mounted thereon. Second substrate 24a has second drive circuit 42a mounted thereon. Third substrate 23b has third drive circuit 40b mounted thereon. Fourth substrate 24b has fourth drive circuit 42b mounted thereon.

Sub-module 301 of the power conversion device further includes a cooling fin 21, a housing frame 55, a first separation frame 52a, and a second separation frame 52b.

Housing frame 55 accommodates cooling fin 21, first IGBT 11a, second IGBT 12a, third IGBT 13a, fourth IGBT 14a, fifth IGBT 11b, sixth IGBT 12b, seventh IGBT 13b, eighth IGBT 14b, first drive circuit 40a, second drive circuit 42a, third drive circuit 40b, fourth drive circuit 42b, first laminated bus bar 22a, second laminated bus bar 22b, first substrate 23a, second substrate 24a, third substrate 23b, and fourth substrate 24b.

Housing frame 55 is a frame body formed in a rectangular parallelepiped frame shape. Cooling fin 21 is located at the center of housing frame 55. In other words, the distance between cooling fin 21 and first surface 71 is equal to the distance between cooling fin 21 and second surface 72. Cooling fin 21 is disposed such that the depth direction of cooling fin 21 is perpendicular to first surface 71 and second surface 72 of housing frame 55 that face each other.

Cooling fin 21 separates the inner space of housing frame 55 into a first space and a second space.

In the first space, first IGBT 11a, second IGBT 12a, third IGBT 13a, and fourth IGBT 14a are disposed closest to cooling fin 21 in parallel with first surface 71 and second surface 72. In the first space, first laminated bus bar 22a is disposed second closest to cooling fin 21 in parallel with first surface 71 and second surface 72. In the first space, first substrate 23a and second substrate 24a are disposed third closest to cooling fin 21 in parallel with first surface 71 and second surface 72. In the first space, first drive circuit 40a and second drive circuit 42a are disposed fourth closest to cooling fin 21 in parallel with first surface 71 and second surface 72.

In the second space, fifth IGBT 11b, sixth IGBT 12b, seventh IGBT 13b, and eighth IGBT 14b are disposed closest to cooling fin 21 in parallel with first surface 71 and second surface 72. In the second space, second laminated bus bar 22b is disposed second closest to cooling fin 21 in parallel with first surface 71 and second surface 72. In the second space, third substrate 23b and fourth substrate 24b are disposed third closest to cooling fin 21 in parallel with first surface 71 and second surface 72. In the second space, third drive circuit 40b and fourth drive circuit 42b are disposed fourth closest to cooling fin 21 in parallel with first surface 71 and second surface 72.

First separation frame 52a separates the first space into a first region 81a and a second region 82a. In first region 81a, first drive circuit 40a, second drive circuit 42a, first substrate 23a, and second substrate 24a are disposed. In second region 82a, first IGBT 11a, second IGBT 12a, third IGBT 13a, fourth IGBT 14a, and first laminated bus bar 22a are disposed.

Second separation frame 52b separates the second space into a third region 81b and a fourth region 82b. In third region 81b, third drive circuit 40b, fourth drive circuit 42b, third substrate 23b, and fourth substrate 24b are disposed. In fourth region 82b, fifth IGBT 11b, sixth IGBT 12b, seventh IGBT 13b, eighth IGBT 14b, and second laminated bus bar 22b are disposed.

First separation frame 52a is joined to first surface 71. A region surrounded by first separation frame 52a and first surface 71 is defined as first region 81a. Second separation frame 52b is joined to second surface 72. A region surrounded by second separation frame 52b and second surface 72 is defined as third region 81b.

In order for air to flow into and out of first region 81a, first surface 71 is provided with two openings Ria and R4a. In order for air to flow into and out of third region 81b, second surface 72 is provided with two openings R3b and R4b.

In order for air to flow into and out of second region 82a, first surface 71 is provided with two openings R2a and R5a. In order for air to flow into and out of fourth region 82b, second surface 72 is provided with two openings R2b and R5b.

In order for air to flow into and out of second region 82a, a third surface 73 of housing frame 55 is provided with an opening R1a. In order for air to flow into and out of fourth region 82b, third surface 73 of housing frame 55 is provided with an opening R1b.

Sub-module 301 of the power conversion device according to the second embodiment configured as described above has the following advantages. First separation frame 52a separates second region 82a from first region 81a. In second region 82a, first IGBT 11a, second IGBT 12a, third IGBT 13a, fourth IGBT 14a, and first laminated bus bar 22a are disposed. In first region 81a, first substrate 23a and second substrate 24a are disposed. This makes it possible to suppress heating of first substrate 23a and second substrate 24a by the heat generated by first IGBT 11a, second IGBT 12a, third IGBT 13a, fourth IGBT 14a, and first laminated bus bar 22a. Second separation frame 52b separates fourth region 82b from third region 81b. In fourth region 82b, fifth IGBT 11b, sixth IGBT 12b, seventh IGBT 13b, eighth IGBT 14b, and second laminated bus bar 22b are disposed. In third region 81b, third substrate 23b and fourth substrate 24b are disposed. This makes it possible to suppress heating of third substrate 23b and fourth substrate 24b by the heat generated by fifth IGBT 11b, sixth IGBT 12b, seventh IGBT 13b, eighth IGBT 14b, and second laminated bus bar 22b.

Further, sub-module 301 of the power conversion device according to the second embodiment has the following advantages.

Figure 6:
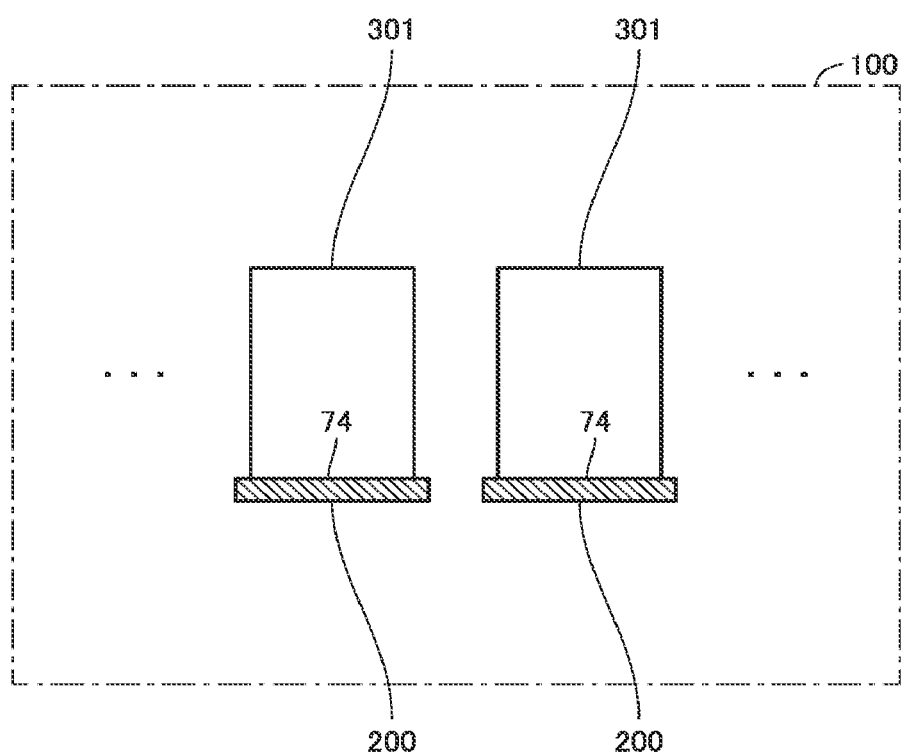
FIG. 6 is a diagram showing an overall structure of power conversion device 100.

FIG. 6 is a diagram showing the overall structure of power conversion device 100.

A plurality of sub-modules 301 are disposed inside power conversion device 100. A support plate 200 is provided to support each of sub-modules 301.

In sub-modules 101a and 101b according to the first embodiment, openings L3a and L3b are provided in fourth surfaces 74a and 74b in contact with support plate 200, so that inflow or outflow of air is inhibited.

In sub-module 301 according to the second embodiment, no opening is provided in fourth surface 74 in contact with support plate 200, so that inflow or outflow of air is not inhibited.

It should be understood that the embodiments disclosed herein are illustrative and non-restrictive in every respect. The scope of the present disclosure is defined by the terms of the claims, rather than the description above, and is intended to include any modifications within the meaning and scope equivalent to the terms of the claims.

REFERENCE SIGNS LIST 1 power system, 1u, 1v, 1w power transmission line, 2, 3 transformer, 4 controller, 5 unit converter, 5a first terminal, 5b second terminal, 15 first capacitor, 18 excitation coil, 21, 21a, 21b cooling fin, 22a, 22b laminated bus bar, 23a, 23b, 24a, 24b substrate, 25a, 25b, 26a, 26b, 200 support plate, 30 main circuit, 32 control circuit, 40, 42, 40a, 40b, 42a, 42b drive circuit, 44 switch operation circuit, 50 power supply, 52a, 52b separation frame, 55, 55a, 55b housing frame, 71, 71a, 71b, 72, 72a, 72b, 73, 73a, 73b, 74, 74a, 74b surface, 80 current-limiting resistance circuit, 81a, 81b, 82a, 82b region, 100 power conversion device, 101a, 101b, 201a, 201b, 301 sub-module, 501, 502 input terminal, A1, A2, A3 arm, C1, C3 current transformer, D1, D4 diode, L1, L2, L3 reactor, L1b, L1a, L2a, L2b, L3b, L3a, L4a, L4b, R1a, R1b, R2a, R2b, R3a, R3b, R4b, R4a, R5a, R5b opening, NL, PL DC line, R1, R3 current limiting resistor, S1, S2, S3, S4, S5, S6, S7 switch, UL, VL, WL AC line.

The invention claimed is:

1. A sub-module of a power conversion device, the sub-module comprising:
   a first IGBT to an eighth IGBT;
   a first drive circuit to a fourth drive circuit that drive the first IGBT to the eight IGBT;
   a first laminated bus bar and a second laminated bus bar on which the first IGBT to the eight IGBT are mounted;
   a first substrate to a fourth substrate on which the first drive circuit to the fourth drive circuit are mounted;
   a housing frame for accommodating the first IGBT to the eight IGBT, the first drive circuit to the fourth drive circuit, the first laminated bus bar, the second laminated bus bar, and the first substrate to the fourth substrate; and
   a first separation frame and a second separation frame for separating a space in which the first drive circuit to the fourth drive circuit and the first substrate to the fourth substrate are disposed from a space in which the first IGBT to the eight IGBT, the first laminated bus bar, and the second laminated bus bar are disposed; and
   a cooling fin disposed in proximity to the first IGBT to the eighty IGBT,
   wherein the first IGBT to the eighth IGBT are disposed between the cooling fin and the first laminated bus bar and between the cooling fin and the second laminated bus bar,
   the first drive circuit drives the first IGBT and the second IGBT,
   the second drive circuit drives the third IGBT and the fourth IGBT,
   the fourth drive circuit drives the fifth IGBT and the sixth IGBT,
   the fourth drive circuit drives the seventh IGBT and the eighth IGBT,
   the first IGBT to the fourth IGBT are mounted on the first laminated bus bar,
   the fifth IGBT to the eighth IGBT are mounted on the second laminated bus bar,
   the first drive circuit, the second drive circuit, the third drive circuit, and the fourth drive circuit are mounted on the first substrate, the second substrate, the third substrate, and
   the fourth substrate, respectively,
   the housing frame accommodates the cooling fin, the first IGBT to the eighth IGBT, the first drive circuit to the fourth drive circuit, the first laminated bus bar, the second laminated bus bar, and the first substrate to the fourth substrate,
   the cooling fin is disposed such that a depth direction of the cooling fin is perpendicular to a first surface and a second surface of the housing frame that face each other, the cooling fin separates an inner space of the housing frame into a first space and a second space, in the first space, the first IGBT to the fourth IGBT, the first laminated bus bar, the first substrate, the second substrate, the first drive circuit, and the second drive circuit are arranged in order from a side close to the cooling fin, in the second space, the fifth IGBT to the eighth IGBT, the second laminated bus bar, the third substrate, the fourth substrate, the third drive circuit, and the fourth drive circuit are arranged in order from a side close to the cooling fin, the first separation frame separates the first space into a first region and a second region, in the first region, the first drive circuit, the second drive circuit, the first substrate, and the second substrate are disposed, and in the second region, the first IGBT to the fourth IGBT and the first laminated bus bar are disposed, and the second separation frame separates the second space into a third region and a fourth region, in the third region, the third drive circuit, the fourth drive circuit, the third substrate, and the fourth substrate are disposed, and in the fourth region, the fifth IGBT to the eighth IGBT and the second laminated bus bar are disposed.

2. The sub-module of the power conversion device according to claim 1, wherein the housing frame is a frame body formed in a rectangular parallelepiped frame shape, and the cooling fin is located at a center position of the housing frame.

3. The sub-module of the power conversion device according to claim 2, wherein the first separation frame and the first surface are joined, and a region surrounded by the first separation frame and the first surface is defined as the first region, and the second separation frame and the second surface are joined, and a region surrounded by the second separation frame and the second surface is defined as the third region.

4. The sub-module of the power conversion device according to claim 3, wherein
the first surface is provided with two openings in order for air to flow into and out of the first region,
the second surface is provided with two openings in order for air to flow into and out of the third region,
the first surface is provided with two openings in order for air to flow into and out of the second region, and
the second surface is provided with two openings in order for air to flow into and out of the fourth region.

5. The sub-module of the power conversion device according to claim 4, wherein
a third surface of the housing frame is further provided with an opening in order for air to flow into and out of the second region, and
the third surface is further provided with an opening in order for air to flow into and out of the fourth region.

* * * * *